United States Patent
Yang

(10) Patent No.: US 10,868,263 B2
(45) Date of Patent: Dec. 15, 2020

(54) FLEXIBLE DISPLAY PANEL AND METHOD FOR MANUFACTURING SAME

(71) Applicant: WUHAN CHINA STAR OPTOELECTRONICS SEMICONDUCTOR DISPLAY TECHNOLOGY CO., LTD., Wuhan (CN)

(72) Inventor: Weiwei Yang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 16/344,363

(22) PCT Filed: Jan. 11, 2019

(86) PCT No.: PCT/CN2019/071438
§ 371 (c)(1),
(2) Date: Apr. 24, 2019

(87) PCT Pub. No.: WO2020/113776
PCT Pub. Date: Jun. 11, 2020

(65) Prior Publication Data
US 2019/0259967 A1   Aug. 22, 2019

(30) Foreign Application Priority Data

Dec. 4, 2018   (CN) .......................... 2018 1 1473883

(51) Int. Cl.
*H01L 51/00* (2006.01)
*G06F 1/16* (2006.01)
(Continued)

(52) U.S. Cl.
CPC ........ *H01L 51/0097* (2013.01); *G06F 1/1652* (2013.01); *H01L 27/3246* (2013.01); *H01L 27/3258* (2013.01); *H01L 51/0023* (2013.01); *H01L 51/5206* (2013.01); *H01L 2251/5338* (2013.01)

(58) Field of Classification Search
None
See application file for complete search history.

(56) References Cited

U.S. PATENT DOCUMENTS

2010/0244668 A1*   9/2010   Nakamura .......... H01L 27/3223
                                                              313/504
2016/0225907 A1    8/2016   Kim et al.
(Continued)

FOREIGN PATENT DOCUMENTS

CN    107579076 A    1/2018
CN    108257972 A    7/2018
(Continued)

*Primary Examiner* — Erik Kielin
(74) *Attorney, Agent, or Firm* — JMB Davis Ben-David

(57) ABSTRACT

The present disclosure provides a flexible display panel and a method for manufacturing same. The present disclosure not only ensures improvement of bending characteristics of display panels but also ensures high pixels per inch (PPI) of the display panels. Moreover, IR-drop is lowered and display uniformity of the panels is increased.

14 Claims, 4 Drawing Sheets

(51) Int. Cl.
    *H01L 27/32*    (2006.01)
    *H01L 51/52*    (2006.01)

(56) References Cited

U.S. PATENT DOCUMENTS

2017/0125505 A1*  5/2017  Oh .......................... H01L 51/52
2017/0262109 A1*  9/2017  Choi ..................... G06F 3/0412
2018/0006098 A1   1/2018  Hong et al.
2018/0366586 A1* 12/2018  Son ..................... H01L 27/3276
2019/0164998 A1*  5/2019  Cho ..................... G09G 3/3266
2019/0355799 A1* 11/2019  Jeong ................. H01L 27/3265
2019/0386034 A1  12/2019  Lee et al.
2020/0144353 A1*  5/2020  Ohara ..................... H01L 51/50

FOREIGN PATENT DOCUMENTS

| CN | 108376672 A | 8/2018 |
| CN | 108493198 A | 9/2018 |
| CN | 108695357 A | 10/2018 |
| CN | 109065575 A | 12/2018 |

\* cited by examiner

```
┌─────────────────────────────────────────────────────────────────────┐
│ providing a flexible substrate, and performing a deposition and     │
│ patterning process to sequentially form a buffer layer, an active   │──S11
│ layer, a first gate insulation layer, a gate electrode layer, and   │
│ a second gate insulation layer on the flexible substrate            │
└─────────────────────────────────────────────────────────────────────┘
                                  │
                                  ▼
┌─────────────────────────────────────────────────────────────────────┐
│ forming a plurality of first contact holes in a display area of the │
│ flexible substrate, wherein a first portion of the first contact    │
│ holes is formed in the first gate insulation layer and the second   │
│ gate insulation layer, and a second portion of the first contact    │
│ holes is formed in the second gate insulation layer; performing a   │
│ deposition and etching process to form a first source and drain     │
│ metal layer on the second gate insulation layer in the display      │──S12
│ area, wherein a first portion of the first source and drain metal   │
│ layer is electrically connected to a first portion of the active    │
│ layer via one of the first contact holes, a second portion of the   │
│ first source and drain metal layer is electrically connected to a   │
│ first portion of the gate electrode layer via one of the first      │
│ contact holes, a third portion of the first source and drain metal  │
│ layer is disposed above a second portion of the gate electrode layer│
└─────────────────────────────────────────────────────────────────────┘
                                  │
                                  ▼
┌─────────────────────────────────────────────────────────────────────┐
│ depositing an organic interlayer dielectric layer on the second     │
│ gate insulation layer, and performing exposure and development for  │──S13
│ the organic interlayer dielectric layer to expose the first source  │
│ and drain metal layer                                               │
└─────────────────────────────────────────────────────────────────────┘
                                  │
                                  ▼
┌─────────────────────────────────────────────────────────────────────┐
│ performing an etching process by using the organic interlayer       │
│ dielectric layer as a mask to form a plurality of second contact    │
│ holes in the display area, wherein a first portion of the second    │
│ contact holes is formed in the first gate insulation layer, the     │
│ second gate insulation layer, and the organic interlayer dielectric │
│ layer, a second portion of the second contact holes is formed in    │
│ the organic interlayer dielectric layer; performing a deposition    │
│ and etching process to form a second source and drain metal layer   │──S14
│ on the organic interlayer dielectric layer in the display area,     │
│ wherein a first portion of the second source and drain metal layer  │
│ is electrically connected to a second portion of the active layer   │
│ via the second contact holes, a second portion of the second source │
│ and drain metal layer is electrically connected to a fourth portion │
│ of the first source and drain metal layer via the second contact holes│
└─────────────────────────────────────────────────────────────────────┘
                                  │
                                  ▼
┌─────────────────────────────────────────────────────────────────────┐
│ performing a deposition and patterning process to sequentially form │
│ a planarization layer, an anode layer, a pixel defining layer, and  │
│ a photoresist layer on the organic interlayer dielectric layer,     │──S15
│ wherein the anode layer is electrically connected to the first      │
│ portion of the second source and drain metal layer                  │
└─────────────────────────────────────────────────────────────────────┘
```

FIG. 1

FLEXIBLE DISPLAY PANEL AND METHOD FOR MANUFACTURING SAME

CROSS-REFERENCE TO RELATED APPLICATIONS

This is the U.S. National Stage of International Patent Application No. PCT/CN2019/071438, filed Jan. 11, 2019, which in turn claims the benefit of Chinese Patent Application No. 201811473883.2 filed Dec. 4, 2018.

FIELD OF INVENTION

The present disclosure relates to a field of display technology, and more particularly, to a flexible display panel and a method for manufacturing same.

BACKGROUND

Having advantages such as light weight, self-illumination, wide viewing angles, low driving voltage, high light-emitting efficiency, low power consumption, and short response times, organic light-emitting diode (OLED) displays are applied in a variety of products. In particular, because flexible OLED displays are bendable and portable, manufacturers focus their attention on research and development of flexible OLED displays.

In use, flexible displays have to be rolled or flexed, or even bended frequently. According to conventional methods for forming a thin film transistor (TFT) that drives OLED devices, an inorganic interlayer dielectric layer is formed after formation of a second gate electrode layer. However, it is prone to result in that stress accumulates in the inorganic interlayer dielectric layer during a bending process of displays, and cracks or breaks are generated in this layer. Thus, lifespan of flexible displays is shortened. In addition, display panels manufactured by conventional processes have a problem of IR-drop (which is a phenomenon where voltage decrease or increase occurs in power or ground networks of integrate circuits). This affects display uniformity of panels, and increases manufacturing risks.

Therefore, there is a need to solve the problems existing in conventional flexible displays by improving bending characteristics thereof, lowering IR-drop, increasing display uniformity thereof, and reducing manufacturing risk thereof.

SUMMARY OF DISCLOSURE

In view of the problems existing in prior art, one objective of the present disclosure is to provide a flexible display panel and a method for manufacturing same. The present disclosure improves bending characteristics of display panels, lowers IR-drop, increases display uniformity of panels, and reduces manufacturing risks.

To achieve the afore-said objective, the present disclosure provides a method for manufacturing a flexible display panel, the method comprising steps of:

(1) providing a flexible substrate, and performing deposition and patterning process to sequentially form a buffer layer, an active layer, a first gate insulation layer, a gate electrode layer, and a second gate insulation layer on the flexible substrate;

(2) forming a plurality of first contact holes in a display area of the flexible substrate, and forming a deep hole in the buffer layer, the first gate insulation layer, and the second gate insulation layer in a bending area of the flexible substrate, wherein a first portion of the first contact holes is formed in the first gate insulation layer and the second gate insulation layer, and a second portion of the first contact holes is formed in the second gate insulation layer; performing deposition and etching process to form a first source and drain metal layer on the second gate insulation layer in the display area and in the deep hole in the bending area, wherein a first portion of the first source and drain metal layer is electrically connected to a first portion of the active layer via one of the first contact holes, a second portion of the first source and drain metal layer is electrically connected to a first portion of the gate electrode layer via one of the first contact holes, a third portion of the first source and drain metal layer is disposed above a second portion of the gate electrode layer, a fourth portion of the first source and drain metal layer is positioned between the third portion of the first source and drain metal layer and the deep hole, and a fifth portion of the first source and drain metal layer is disposed in the deep hole and is formed to have a stepped structure;

(3) depositing an organic interlayer dielectric layer on the second gate insulation layer, and performing exposure and development for the organic interlayer dielectric layer to expose the first source and drain metal layer;

(4) performing etching process by using the organic interlayer dielectric layer as a mask to form a plurality of second contact holes in the display area and the bending area, wherein a first portion of the second contact holes is formed in the first gate insulation layer, the second gate insulation layer, and the organic interlayer dielectric layer in the display area, a second portion of the second contact holes is formed in the organic interlayer dielectric layer in the display area, and a third portion of the second contact holes is formed in the organic interlayer dielectric layer in the bending area and is positioned to correspond to two ends of the deep hole; performing deposition and etching process to form a second source and drain metal layer on the organic interlayer dielectric layer, wherein a first portion of the second source and drain metal layer is electrically connected to a second portion of the active layer via the second contact holes, a second portion of the second source and drain metal layer is electrically connected to the fourth portion of the first source and drain metal layer via the second contact holes, and a third portion of the second source and drain metal layer is electrically connected to the fifth portion of the first source and drain metal layer via the second contact holes; and (5) performing deposition and patterning process to sequentially form a planarization layer, an anode layer, a pixel defining layer, and a photoresist layer on the organic interlayer dielectric layer, wherein the anode layer is electrically connected to the first portion of the second source and drain metal layer.

To achieve the afore-said objective, the present disclosure further provides a method for manufacturing a flexible display panel, the method comprising steps of:

(1) providing a flexible substrate, and performing deposition and patterning process to sequentially form a buffer layer, an active layer, a first gate insulation layer, a gate electrode layer, and a second gate insulation layer on the flexible substrate;

(2) forming a plurality of first contact holes in a display area of the flexible substrate, wherein a first portion of the first contact holes is formed in the first gate insulation layer and the second gate insulation layer, and a second portion of the first contact holes is formed in the second gate insulation layer; performing deposition and etching process to form a first source and drain metal layer on the second gate insulation layer in the display area, wherein a first portion of the first source and drain metal layer is electrically connected to a first portion of the active layer via one of the first contact holes, a second portion of the first source and drain metal layer is electrically connected to a first portion of the gate electrode layer via one of the first contact holes, a third portion of the first source and drain metal layer is disposed above a second portion of the gate electrode layer;

(3) depositing an organic interlayer dielectric layer on the second gate insulation layer, and performing exposure and development for the organic interlayer dielectric layer to expose the first source and drain metal layer;

(4) performing etching process by using the organic interlayer dielectric layer as a mask to form a plurality of second contact holes in the display area, wherein a first portion of the second contact holes is formed in the first gate insulation layer, the second gate insulation layer, and the organic interlayer dielectric layer, a second portion of the second contact holes is formed in the organic interlayer dielectric layer; performing deposition and etching process to form a second source and drain metal layer on the organic interlayer dielectric layer in the display area, wherein a first portion of the second source and drain metal layer is electrically connected to a second portion of the active layer via the second contact holes, a second portion of the second source and drain metal layer is electrically connected to a fourth portion of the first source and drain metal layer via the second contact holes; and (5) performing deposition and patterning process to sequentially form a planarization layer, an anode layer, a pixel defining layer, and a photoresist layer on the organic interlayer dielectric layer, wherein the anode layer is electrically connected to the first portion of the second source and drain metal layer.

To achieve the afore-said objective, the present disclosure further provides a flexible display panel, comprising:

a flexible substrate having a display area;

a buffer layer, an active layer, a first gate insulation layer, a gate electrode layer, and a second gate insulation layer sequentially disposed on the flexible substrate;

a first source and drain metal layer disposed on the second gate insulation layer in the display area, wherein a first portion of the first source and drain metal layer is electrically connected to a first portion of the active layer via one of a plurality of first contact holes, a second portion of the first source and drain metal layer is electrically connected to a first portion of the gate electrode layer via one of the first contact holes, a third portion of the first source and drain metal layer is disposed above a second portion of the gate electrode layer;

an organic interlayer dielectric layer disposed on the second gate insulation layer, wherein the organic interlayer dielectric layer is exposed and developed to expose the first source and drain metal layer;

a second source and drain metal layer disposed on the organic interlayer dielectric layer in the display area, wherein a first portion of the second source and drain metal layer is electrically connected to a second portion of the active layer via a plurality of second contact holes, a second portion of the second source and drain metal layer is electrically connected to a fourth portion of the first source and drain metal layer via the second contact holes; and a planarization layer, an anode layer, a pixel defining layer, and a photoresist layer sequentially disposed on the organic interlayer dielectric layer, wherein the anode layer is electrically connected to the first portion of the second source and drain metal layer.

According to the present disclosure, organic material having excellent bending property is used to form the interlayer dielectric layer, therefore bending characteristics of flexible display panel is improved. In addition, contact holes in display area and deep hole in bending area are formed after formation of the second gate insulation layer. A part of contact holes are formed at the manufacturing process stage of the first source and drain metal layer. Thus, the holes formed at the manufacturing process stage of the second source and drain metal layer can have low hole density. Therefore, the present disclosure not only ensures improvement of bending characteristics of display panels but also ensures high pixels per inch (PPI) of display panels. Moreover, with formation of a two-layered structure of source and drain metal layers, IR-drop is lowered, and display uniformity of panels is increased. Further, the design of two-layered metal wiring structure in bending area can further lower IR-drop and reduce manufacturing risks.

BRIEF DESCRIPTION OF DRAWINGS

To detailedly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

FIG. 1 shows a flowchart of a method for manufacturing a flexible display panel according to the present disclosure.

DETAILED DESCRIPTION

Figure 2A:
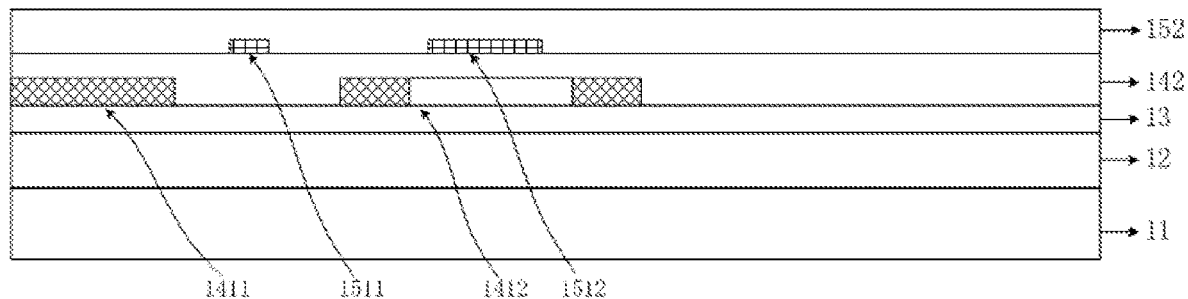
FIGS. 2A-2F show each stage of a method for manufacturing a flexible display panel according to the present disclosure.

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of the second feature, or just means that the first feature is at a height lower than that of the second feature.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

In a method of the present disclosure for manufacturing a flexible display panel, an organic material having an excellent bending property is used to form an interlayer dielectric layer, therefore bending characteristics of the flexible display panel is improved. In addition, contact holes (CNT) in a display area and a deep hole in a bending area are formed after formation of a second gate insulation layer. Thus, the present disclosure not only ensures improvement of the bending characteristics of the display panels but also ensures high pixels per inch (PPI) of the display panels. Moreover, with formation of a two-layered structure of source and drain metal layers, an IR-drop is lowered, and display uniformity of panels is increased. Further, the design of a two-layered metal wiring structure in the bending area can further lower the IR-drop and reduce manufacturing risks.

Figure 2B:
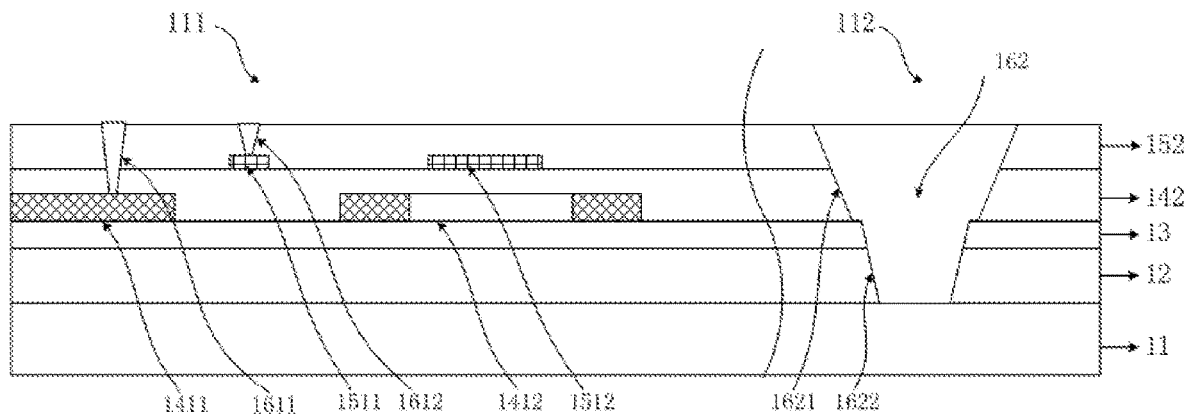
Figure 2C:
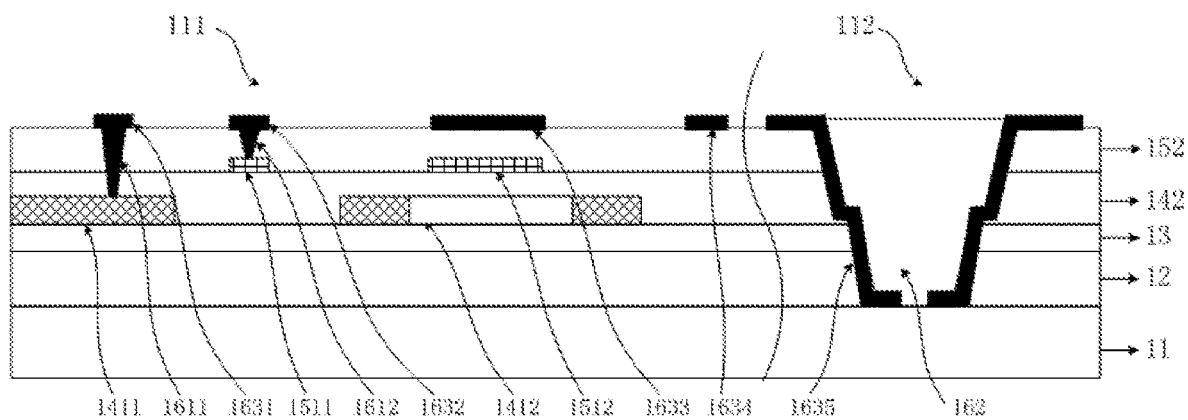
Figure 2D:
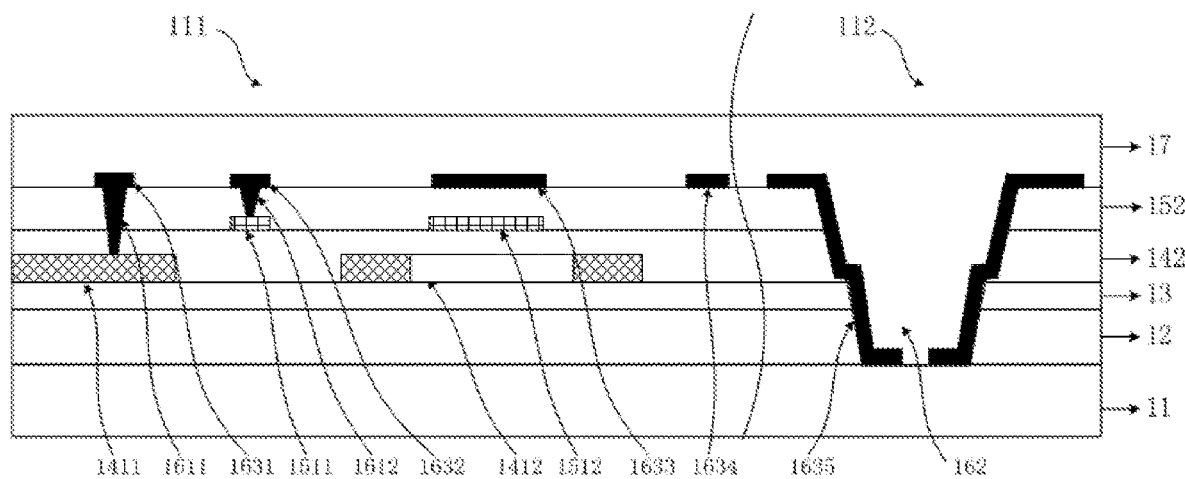
Figure 2E:
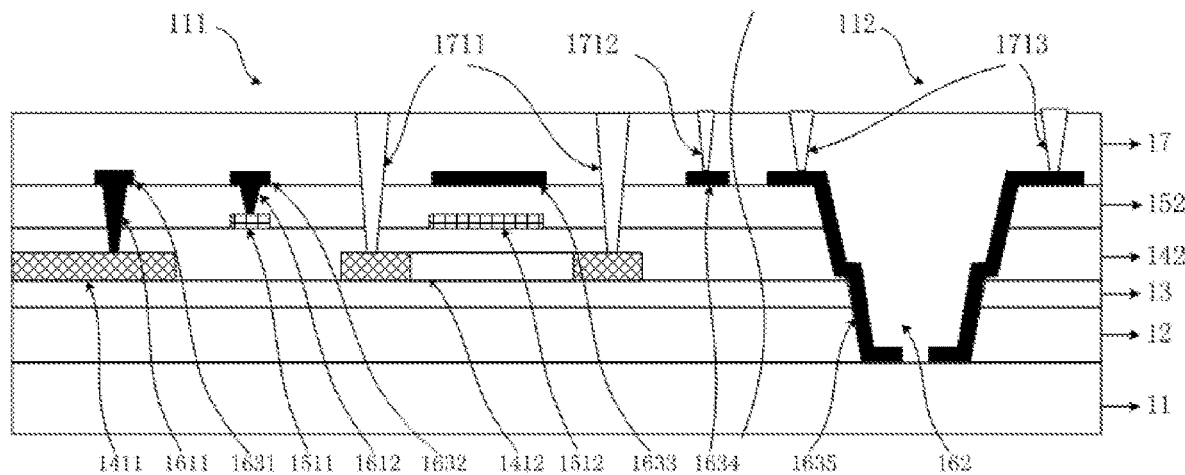
Figure 2F:
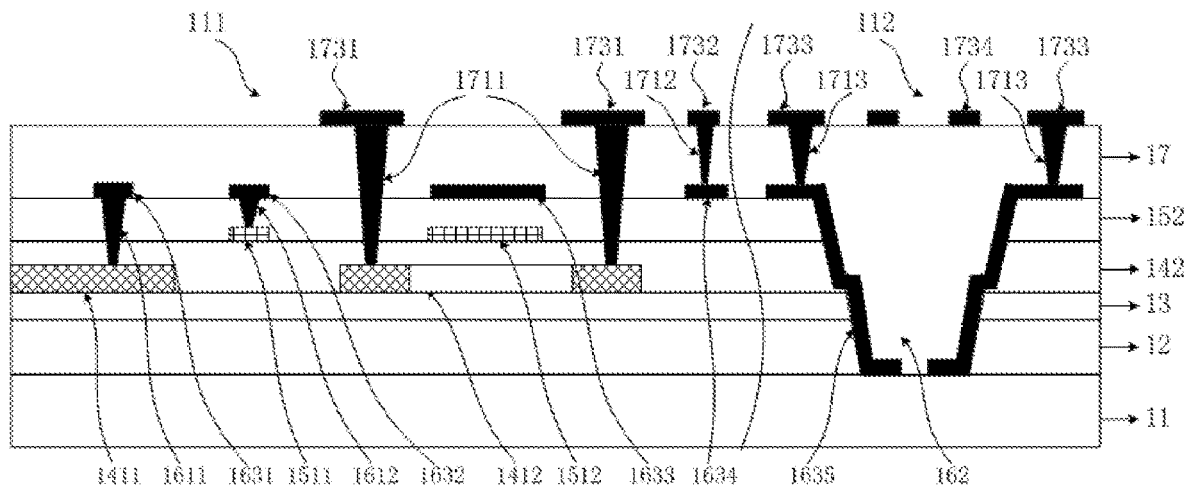
Figure 3:
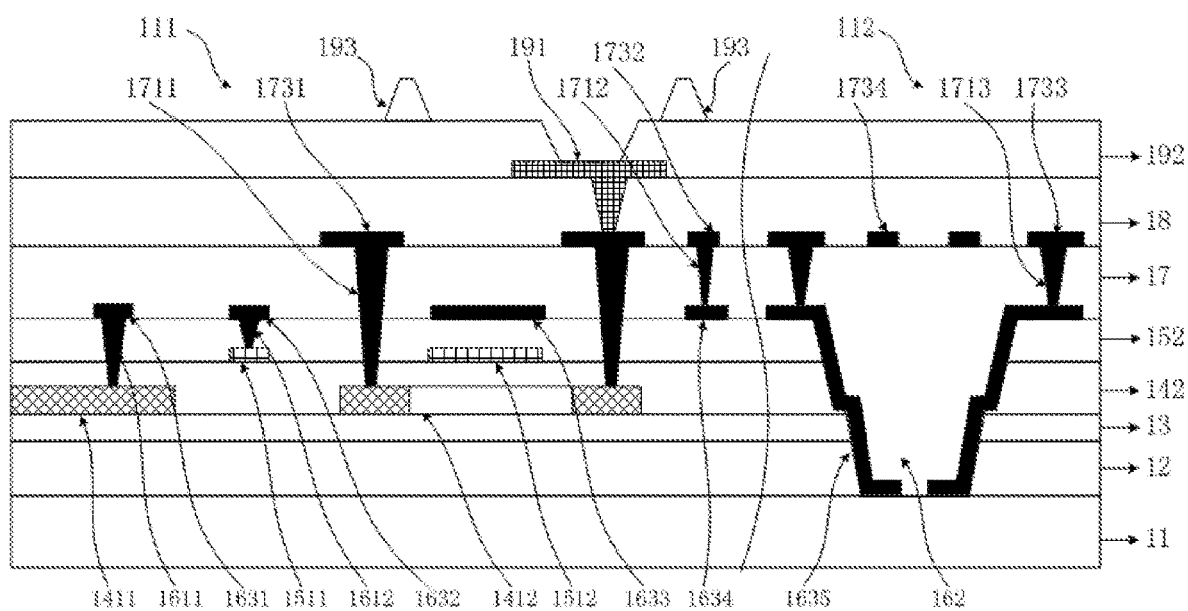
FIG. 3 shows a cross-sectional view of a structure of a flexible display panel according to the present disclosure.

Please see FIG. 1, FIGS. 2A-2F, and FIG. 3. FIG. 1 shows a flowchart of a method for manufacturing a flexible display panel according to the present disclosure. FIGS. 2A-2F show each stage of the method for manufacturing the flexible display panel according to the present disclosure. FIG. 3 shows a cross-sectional view of a structure of a flexible display panel according to the present disclosure. The method comprises the following steps: S11: providing a flexible substrate, and performing a deposition and patterning process to sequentially form a buffer layer, an active layer, a first gate insulation layer, a gate electrode layer, and a second gate insulation layer on the flexible substrate; S12: forming a plurality of first contact holes in a display area of the flexible substrate, wherein a first portion of the first contact holes is formed in the first gate insulation layer and the second gate insulation layer, and a second portion of the first contact holes is formed in the second gate insulation layer; performing a deposition and etching process to form a first source and a drain metal layer on the second gate insulation layer in the display area, wherein a first portion of the first source and drain metal layer is electrically connected to a first portion of the active layer via one of the first contact holes, a second portion of the first source and drain metal layer is electrically connected to a first portion of the gate electrode layer via one of the first contact holes, a third portion of the first source and drain metal layer is disposed above a second portion of the gate electrode layer; S13: depositing an organic interlayer dielectric layer on the second gate insulation layer, and performing exposure and development for the organic interlayer dielectric layer to expose the first source and drain metal layer; S14: performing the etching process by using the organic interlayer dielectric layer as a mask to form a plurality of second contact holes in the display area, wherein a first portion of the second contact holes is formed in the first gate insulation layer, the second gate insulation layer, and the organic interlayer dielectric layer, a second portion of the second contact holes is formed in the organic interlayer dielectric layer; performing a deposition and etching process to form a second source and drain metal layer on the organic interlayer dielectric layer in the display area, wherein a first portion of the second source and drain metal layer is electrically connected to a second portion of the active layer via the second contact holes, a second portion of the second source and drain metal layer is electrically connected to a fourth portion of the first source and drain metal layer via the second contact holes; S15: performing a deposition and patterning process to sequentially form a planarization layer, an anode layer, a pixel defining layer, and a photoresist layer on the organic interlayer dielectric layer, wherein the anode layer is electrically connected to the first portion of the second source and drain metal layer. Detailed descriptions for the method of the present disclosure is provided below.

In the step S11, this step comprises: providing a flexible substrate, and performing a deposition and patterning process to sequentially form a buffer layer, an active layer, a first gate insulation layer, a gate electrode layer, and a second gate insulation layer on the flexible substrate. Please refer to FIG. 1 and FIG. 2A. FIG. 2A shows that the buffer layer, the active layer, the first gate insulation layer, the gate electrode layer, and the second gate insulation layer are sequentially formed on the flexible substrate according to one embodiment of the present disclosure. A barrier layer is further included between the flexible substrate (PI) and the buffer layer (Buf). Specifically, the flexible substrate 11 is provided. The barrier layer 12 is formed on the flexible substrate 11. The buffer layer 13 is formed on the barrier layer 12. The active layer (Act) is formed on the buffer layer 13. The first gate insulation layer (GI1) 142 is formed on the buffer layer 13, wherein the first gate insulation layer 142 covers the active layer. A metal layer is deposited on the first gate insulation layer 142 and is patterned to form the gate electrode layer (GE1). The second gate insulation layer (GI2) 152 is formed on the gate electrode layer, wherein the second gate insulation layer 152 covers the gate electrode layer. The active layer comprises two portions. A first portion 1411 of the active layer includes a doped polysilicon region. A second portion 1412 of the active layer includes a polysilicon region, and the doped polysilicon region formed at two ends of the polysilicon region. The gate electrode layer comprises two portions. A first portion 1511 of the gate electrode layer is metal wiring. A second portion 1512 of the gate electrode layer is a gate electrode located above the second portion 1412.

In the step S12, this step comprises: forming a plurality of first contact holes in a display area of the flexible substrate, wherein a first portion of the first contact holes is formed in the first gate insulation layer and the second gate insulation layer, and a second portion of the first contact holes is formed in the second gate insulation layer; performing a deposition and etching process to form a first source and drain metal layer on the second gate insulation layer in the display area, wherein a first portion of the first source and drain metal layer is electrically connected to a first portion of the active layer via one of the first contact holes, a second portion of the first source and drain metal layer is electrically connected to a first portion of the gate electrode layer via one of the first contact holes, a third portion of the first source and drain metal layer is disposed above a second portion of the gate electrode layer. Please refer to FIG. 1 and FIGS. 2B-2C. FIG. 2B shows that the plurality of first contact holes are formed according to one embodiment of the present disclosure. FIG. 2C shows that the first source and drain metal layer is formed according to one embodiment of the present disclosure.

As shown in FIG. 2B, the flexible substrate 11 has the display area 111 and the bending area 112. The plurality of first contact holes are formed in the display area 111. The first portion 1611 of the first contact holes is formed in the first gate insulation layer 142 and the second gate insulation layer 142, and is positioned to correspond to two ends of the first portion 1411 of the active layer. (The drawing only shows one end of the first portion 1411.) The second portion 1612 of the first contact holes is formed in the second gate insulation layer 152, and is positioned to correspond to the first portion 1511 of the gate electrode layer.

Preferably, at the same time, a deep hole 162 is formed in the bending area 112 in the buffer layer 13, the first gate insulation layer 142, and the second gate insulation layer 152. Specifically, formation of the deep hole 162 can include steps of: forming a first opening 1621 in the first gate insulation layer 142 and the second gate insulation layer 152 in the bending area 112; and forming a second opening 1622 in the buffer layer 13 in the bending area 112 to correspond to the first opening 1621, wherein the second opening 1622 is connected to the first opening 1621 to constitute the deep hole 162.

That is, after formation of the second gate insulation layer, holes are formed in the display area and in the bending area. Formation of the holes includes two steps: the contact holes (CNT holes) in the display area and the first opening 1621 (DH1 hole) in the bending area are formed first, and the second opening 1622 (DH2 hole) is then formed at a location where the DH1 hole is located. This makes a part of the contact holes that connect the first source and drain metal layer to the gate electrode layer (SD1-GE1), and that connect the first source and drain metal layer to the active layer (SD1-poly) be formed at the manufacturing process stage of the first source and drain metal layer (SD1). Therefore, the holes formed at the manufacturing process stage of the second source and drain metal layer (SD2) can have low hole density, thus ensuring high PPI. A bottom of the second opening 1622 is disposed on the flexible substrate 11 in the bending area 112 or is disposed on the buffer layer 13 in the bending area 112. That is, the hole formed in the bending area has a depth extending to the flexible substrate, or the barrier layer is remained on the flexible substrate. Preferably, a size of the first opening 1621 is greater than a size of the second opening 1622, such that the second opening 1622 is entirely exposed. As such, the first source and drain metal layer formed later in the deep hole 162 by performing a deposition and etching process can be formed to have a stepped structure, further improving panel bending characteristics.

As shown in FIG. 2C, the first source and drain metal layer (SD1) is formed in the display area 112 on the second gate insulation layer 152 by performing a deposition and etching process. A first portion 1631 of the first source and drain metal layer is electrically connected to the first portion 1411 of the active layer via the first contact holes (i.e., the first portion 1611 of the first contact holes). A second portion 1632 of the first source and drain metal layer is electrically connected to the first portion 1511 of the gate electrode layer via the first contact holes (i.e., the second portion 1612 of the first contact holes). A third portion 1633 of the first source and drain metal layer is disposed above the second portion 1512 of the gate electrode layer. In addition, a fourth portion 1634 of the first source and drain metal layer is positioned between the third portion 1633 of the first source and drain metal layer and the deep hole 162, and is used to receive signals. The first portion 1631, the second portion 1632, and the fourth portion 1634 of the first source and drain metal layer can be metal wiring. The third portion 1633 of the first source and drain metal layer and the second portion 1512 of the gate electrode layer function as an upper electrode plate and a lower electrode plate of a capacitor, respectively.

Preferably, at the same time, the first source and drain metal layer (i.e., a fifth portion 1635 of the first source and drain metal layer) is formed in the bending area 112 in the deep hole 162 by performing a deposition and etching process. The fifth portion 1635 of the first source and drain metal layer is formed to have a stepped structure in the deep hole 162. The SD1 in the display area and the SD1 in the bending area are formed using the same process, therefore the manufacturing process is simplified, and manufacturing cost is lowered.

In the step S13, this step comprises: depositing an organic interlayer dielectric layer on the second gate insulation layer, and performing exposure and development for the organic interlayer dielectric layer to expose the first source and drain metal layer. Please refer to FIG. 1 and FIG. 2D. FIG. 2D shows that the organic interlayer dielectric layer is deposited according to one embodiment of the present disclosure. Specifically, an organic material is deposited on the second gate electrode insulation layer 152 to form the organic interlayer dielectric layer (OILD) 17. The organic interlayer dielectric layer 17 fills the bending area, and the exposure and development are performed for the organic interlayer dielectric layer in other regions to generate patterns (that is, the exposure and development are performed to expose the first source and drain metal layer). With regard to material used for the interlayer dielectric layer that is formed after formation of the second gate insulation layer (GI2), replacing the inorganic interlayer dielectric layer with the organic interlayer dielectric layer can improve bending characteristics of flexible displays. However, formation of holes in the organic material would make holes have larger sizes. And, high PPI requires that holes have high hole density. High PPI would be difficult to be achieved by simply changing the material used for the interlayer dielectric layer. Therefore, according to the present disclosure, after formation of the second gate insulation layer (GI2), a part of the contact holes that connect the first source and drain metal layer to the gate electrode layer (SD1-GE1) and that connect the first source and drain metal layer to the active layer (SD1-poly) are formed at the manufacturing process stage of the first source and drain metal layer (SD1). This can reduce hole density at the manufacturing process stage of the second source and drain metal layer (SD2), thus ensuring high PPI.

In the step S14, this step comprises: performing an etching process by using the organic interlayer dielectric layer as a mask to form a plurality of second contact holes in the display area, wherein a first portion of the second contact holes is formed in the first gate insulation layer, the second gate insulation layer, and the organic interlayer dielectric layer, a second portion of the second contact holes is formed in the organic interlayer dielectric layer; performing a deposition and etching process to form the second source and drain metal layer on the organic interlayer dielectric layer in the display area, wherein a first portion of the second source and drain metal layer is electrically connected to a second portion of the active layer via the second contact holes, a second portion of the second source and drain metal layer is electrically connected to a fourth portion of the first source and drain metal layer via the second contact holes. Please refer to FIG. 1 and FIGS. 2E-2F. FIG. 2E shows that the plurality of second contact holes are formed according to one embodiment of the present disclosure. FIG. 2F shows that the second source and drain metal layer is formed according to one embodiment of the present disclosure.

As shown in FIG. 2E, the plurality of second contact holes are formed in the display area 111 by performing an etching process using the organic interlayer dielectric layer 17 as a mask. A first portion 1711 of the second contact holes is formed in the first gate insulation layer 142, the second gate insulation layer 152, and the organic interlayer dielectric layer 17, and is positioned to correspond to two ends of the second portion 1412 of the active layer. A second portion 1712 of the second contact holes is formed in the organic interlayer dielectric layer 17, and is positioned to correspond to the fourth portion 1634 of the first source and drain metal layer.

Preferably, at the same time, the second contact holes (i.e., a third portion 1713 of the second contact holes) are formed in the bending area 112 in the organic interlayer dielectric layer 17, wherein the third portion 1713 of the second contact holes is positioned to correspond to two ends of the deep hole 162. That is, the organic interlayer dielectric layer is used as the mask during the etching process to form the second contact holes in the display area and in the bending area.

As shown in FIG. 2F, the second source and drain metal layer (SD2) is formed in the display area 112 on the organic interlayer dielectric layer 17 by performing a deposition and etching process. A first portion 1731 of the second source and drain metal layer is electrically connected to the second portion 1412 of the active layer via the second contact holes (i.e., the first portion 1711 of the second contact holes). A second portion 1732 of the second source and drain metal layer is electrically connected to the fourth portion 1634 of the first source and drain metal layer via the second contact holes (i.e., the second portion 1712 of the second contact holes). The first portion 1731 of the second source and drain metal layer functions as a source electrode and a drain electrode. The second portion 1732 of the second source and drain metal layer can be metal wiring.

Preferably, at the same time, the second source and drain metal layer is formed in the bending area 112 on the organic interlayer dielectric layer 17 by performing a deposition and etching process. A portion of the second source and drain metal layer (i.e., a third portion 1733 of the second source and drain metal layer) in the bending area 112 is electrically connected to the first source and drain metal layer (i.e., a fifth portion 1635 of the first source and drain metal layer) via the second contact holes in the bending area 112 (i.e., the third portion 1713 of the second contact holes). Another portion of the second source and drain metal layer (i.e., a fourth portion 1734 of the second source and drain metal layer) in the bending area 112 is directly formed on the organic interlayer dielectric layer 17. The third portion 1733 and the fourth portion 1734 of the second source and drain metal layer can be metal wiring. The SD2 in the display area and the SD2 in the bending area are formed using the same process, therefore the manufacturing process is simplified, and manufacturing cost is lowered.

In the step S15, this step comprises: performing a deposition and patterning process to sequentially form a planarization layer, an anode layer, a pixel defining layer, and a photoresist layer on the organic interlayer dielectric layer, wherein the anode layer is electrically connected to the first portion of the second source and drain metal layer. Please refer to FIG. 1 and FIG. 3. FIG. 3 shows a cross-sectional view of a structure of a flexible display panel according to one embodiment of the present disclosure. The planarization layer (PLN) 18, the anode layer (AND) 191, the pixel defining layer (PDL) 192, and the photoresist layer (PS) 193 are sequentially formed on the organic interlayer dielectric layer 17 by performing a deposition and patterning process. The anode layer 191 is positioned above the second source and drain metal layer, and is electrically connected to the first portion 1731 of the second source and drain metal layer.

The method for manufacturing display panels, as disclosed by the present disclosure, ensures high PPI, improves bending characteristics of flexible displays, lowers IR-drop, increases display uniformity of panels, and reduces manufacturing risks of a bending area.

According to one preferred embodiment of the present disclosure, the method for manufacturing flexible display panels comprises: sequentially forming a buffer layer, an active layer (Act), a first gate insulation layer (GI1), a gate electrode layer (GE1), and a second gate insulation layer (GI2) of a thin film transistor (TFT) device on a flexible substrate (PI); forming a plurality of first contact holes (CNT1 holes) in the display area and forming a first opening (DH1 hole) in the bending area after formation of GI2 first, and then forming a second opening (DH2 hole) in the bending area (alternatively, the barrier layer is remained on the PI); performing a deposition and etching process to form a first source and drain metal layer (SD1), wherein the SD1 is electrically connected to the active layer and the SD1 is electrically connected to the doped polysilicon of the active layer and is electrically connected to the gate electrode layer in the display area, and the SD1 is formed to have a stepped structure in the DH2 hole in the bending area; forming an organic interlayer dielectric layer (OILD), and filling the bending area, while exposure and development are performed for the organic interlayer dielectric layer in other regions to generate patterns; forming a plurality of second contact holes (CNT2 holes) by using the organic interlayer dielectric layer as a mask; forming a second source and drain metal layer (SD2), wherein the SD2 is electrically connected to the doped polysilicon of the active layer and is electrically connected to SD1 in the display area, and the SD2 is electrically connected to the SD1 in the bending area; and finally, formally forming a planarization layer (PLN), an anode layer (AND), a pixel defining layer (PDL), and a photoresist layer (PS).

Please refer to FIG. 3, which shows a cross-sectional view of a structure of a flexible display panel according to the present disclosure. The flexible display panel of the present disclosure comprises: a flexible substrate 11 having a display area 111; a buffer layer 13, an active layer, a first gate insulation layer 142, a gate electrode layer, and a second gate insulation layer 152 sequentially disposed on the flexible substrate; a first source and drain metal layer disposed on the second gate insulation layer 152 in the display area 111, wherein a first portion 1631 of the first source and drain metal layer is electrically connected to a first portion 1411 of the active layer via one of a plurality of first contact holes (i.e., a first portion 1611 of the first contact holes), a second portion 1632 of the first source and drain metal layer is electrically connected to the first portion 1511 of the gate electrode layer via one of the first contact holes (i.e., the second portion 1612 of the first contact holes), a third portion 1633 of the first source and drain metal layer is disposed above a second portion 1512 of the gate electrode layer; an organic interlayer dielectric layer 17 disposed on the second gate insulation layer 152, wherein the organic interlayer dielectric layer 17 is exposed and developed to expose the first source and drain metal layer; a second source and drain metal layer disposed on the organic interlayer dielectric layer 17 in the display area 111, wherein a first portion 1731 of the second source and drain metal layer is electrically connected to a second portion 1412 of the active layer via a plurality of second contact holes (i.e., a first portion 1711 of the second contact holes), a second portion 1732 of the second source and drain metal layer is electrically connected to a fourth portion 1634 of the first source and drain metal layer via the second contact holes (i.e., a second portion 1712 of the second contact holes); and a planarization layer 18, an anode layer 191, a pixel defining layer 192, and a photoresist layer 193 sequentially disposed on the organic interlayer dielectric layer 17, wherein the anode layer 191 is disposed above the second source and drain metal layer and is electrically connected to the first portion 1731 of the second source and drain metal layer.

In addition, the fourth portion 1634 of the first source and drain metal layer in the display area 111 is electrically connected to the metal layer formed the later, and is used to receive signals. The first portion 1631, the second portion 1632, and the fourth portion 1634 of the first source and drain metal layer can be metal wiring. The third portion 1633 of the first source and drain metal layer and the second portion 1512 of the gate electrode layer function as an upper electrode plate and a lower electrode plate of a capacitor, respectively. The first portion 1731 of the second source and drain metal layer functions as a source electrode and a drain electrode. The second portion 1732 of the second source and drain metal layer can be metal wiring.

With regard to material used for the interlayer dielectric layer that is formed after formation of the second gate insulation layer (GI2), replacing the inorganic interlayer dielectric layer with an organic interlayer dielectric layer can improve bending characteristics of flexible display panels because organic material has an excellent bending property. In addition, contact holes in the display area and a deep hole in the bending area are formed after formation of the second gate insulation layer. A part of contact holes are formed at the manufacturing process stage of the first source and drain metal layer. Thus, the holes formed at the manufacturing process stage of the second source and drain metal layer can have low hole density. Therefore, the present disclosure not only ensures improvement of display panel bending characteristics but also ensures high display panel PPI. Moreover, with formation of a two-layered structure of source and drain metal layers, IR-drop is lowered, and display uniformity of panels is increased. Further, the design of two-layered metal wiring structure in the bending area can further lower IR-drop and reduce manufacturing risks.

Preferably, the flexible substrate 11 further has the bending area 112. The first source and drain metal layer (i.e., the fifth portion 1635 of the first source and drain metal layer) is further disposed in the deep hole 162 in the bending area 112, and is configured to have a stepped structure in the deep hole 162. In the present embodiment, a bottom of the deep hole 162 is disposed on the flexible substrate 11 in the bending area 112. In other embodiments, the bottom of the deep hole 162 can be disposed on the buffer layer 13 in the bending area 112 as well. That is, the hole formed in the bending area has a depth extending to the flexible substrate, or the barrier layer is remained on the flexible substrate.

Preferably, the second source and drain metal layer is further disposed on the organic interlayer dielectric layer 17 in the bending area 112. A portion of the second source and drain metal layer (i.e., the third portion 1733 of the second source and drain metal layer) in the bending area 112 is electrically connected to the first source and drain metal layer (i.e., the fifth portion 1635 of the first source and drain metal layer) in the bending area 112 via the second contact holes (i.e., the third portion 1713 of the second contact holes) in the bending area 112. Further, another portion of the second source and drain metal layer (i.e., the fourth portion 1734 of the second source and drain metal layer) in the bending area 112 is directly formed on the organic interlayer dielectric layer 17. The third portion 1733 and the fourth portion 1734 of the second source and drain metal layer can be metal wiring.

INDUSTRIAL APPLICABILITY

The inventions disclosed in the present disclosure can be manufactured and used in industry, and thus is industrial applicable.

What is claimed is:

1. A method for manufacturing a flexible display panel, the method comprising steps of:
   (1) providing a flexible substrate, and performing a deposition and patterning process to sequentially form a buffer layer, an active layer, a first gate insulation layer, a gate electrode layer, and a second gate insulation layer on the flexible substrate;
   (2) forming a plurality of first contact holes in a display area of the flexible substrate, and forming a deep hole in the buffer layer, the first gate insulation layer, and the second gate insulation layer in a bending area of the flexible substrate, wherein a first portion of the plurality of first contact holes is formed in the first gate insulation layer and the second gate insulation layer, and a second portion of the plurality of first contact holes is formed in the second gate insulation layer; performing a deposition and etching process to form a first source and drain metal layer on the second gate insulation layer in the display area and in the deep hole in the bending area, wherein a first portion of the first source and drain metal layer is electrically connected to a first portion of the active layer via one of the plurality of first contact holes, a second portion of the first source and drain metal layer is electrically connected to a first portion of the gate electrode layer via one of the plurality of first contact holes, a third portion of the first source and drain metal layer is disposed above a second portion of the gate electrode layer, a fourth portion of the first source and drain metal layer is positioned between the third portion of the first source and drain metal layer and the deep hole, and a fifth portion of the first source and drain metal layer is disposed in the deep hole and is formed to have a stepped structure;
   (3) depositing an organic interlayer dielectric layer on the second gate insulation layer, and performing exposure and development for the organic interlayer dielectric layer to expose the first source and drain metal layer;
   (4) performing an etching process by using the organic interlayer dielectric layer as a mask to form a plurality of second contact holes in the display area and the bending area, wherein a first portion of the plurality of second contact holes is formed in the first gate insulation layer, the second gate insulation layer, and the organic interlayer dielectric layer in the display area, a second portion of the plurality of second contact holes is formed in the organic interlayer dielectric layer in the display area, and a third portion of the plurality of second contact holes is formed in the organic interlayer dielectric layer in the bending area and is positioned to correspond to two ends of the deep hole; performing a deposition and etching process to form a second source and drain metal layer on the organic interlayer dielectric layer, wherein a first portion of the second source and drain metal layer is electrically connected to a second portion of the active layer via the plurality of second contact holes, a second portion of the second source and drain metal layer is electrically connected to the fourth portion of the first source and drain metal layer via the plurality of second contact holes, and a third portion of the second source and drain metal layer is electrically connected to the fifth portion of the first source and drain metal layer via the plurality of second contact holes; and (5) performing a deposition and patterning process to sequentially form a planarization layer, an anode layer, a pixel defining layer, and a photoresist layer on the organic interlayer dielectric layer, wherein the anode layer is electrically connected to the first portion of the second source and drain metal layer.

2. The method for manufacturing the flexible display panel according to claim 1, wherein the step of forming the deep hole in the buffer layer, the first gate insulation layer, and the second gate insulation layer in the bending area comprises:

forming a first opening in the first gate insulation layer and the second gate insulation layer in the bending area; and forming a second opening in the buffer layer in the bending area to correspond to the first opening, wherein the second opening is connected to the first opening to constitute the deep hole.

3. The method for manufacturing the flexible display panel according to claim 2, wherein a bottom of the second opening is disposed on the flexible substrate in the bending area or is disposed on the buffer layer in the bending area.

4. The method for manufacturing the flexible display panel according to claim 2, wherein a size of the first opening is greater than a size of the second opening, such that the second opening is entirely exposed.

5. A method for manufacturing a flexible display panel, the method comprising steps of:

(1) providing a flexible substrate, and performing a deposition and patterning process to sequentially form a buffer layer, an active layer, a first gate insulation layer, a gate electrode layer, and a second gate insulation layer on the flexible substrate;

(2) forming a plurality of first contact holes in a display area of the flexible substrate, wherein a first portion of the plurality of first contact holes is formed in the first gate insulation layer and the second gate insulation layer, and a second portion of the plurality of first contact holes is formed in the second gate insulation layer; performing a deposition and etching process to form a first source and drain metal layer on the second gate insulation layer in the display area, wherein a first portion of the first source and drain metal layer is electrically connected to a first portion of the active layer via one of the plurality of first contact holes, a second portion of the first source and drain metal layer is electrically connected to a first portion of the gate electrode layer via one of the plurality of first contact holes, a third portion of the first source and drain metal layer is disposed above a second portion of the gate electrode layer;

(3) depositing an organic interlayer dielectric layer on the second gate insulation layer, and performing exposure and development for the organic interlayer dielectric layer to expose the first source and drain metal layer;

(4) performing an etching process by using the organic interlayer dielectric layer as a mask to form a plurality of second contact holes in the display area, wherein a first portion of the plurality of second contact holes is formed in the first gate insulation layer, the second gate insulation layer, and the organic interlayer dielectric layer, a second portion of the plurality of second contact holes is formed in the organic interlayer dielectric layer; performing a deposition and etching process to form a second source and drain metal layer on the organic interlayer dielectric layer in the display area, wherein a first portion of the second source and drain metal layer is electrically connected to a second portion of the active layer via the plurality of second contact holes, a second portion of the second source and drain metal layer is electrically connected to a fourth portion of the first source and drain metal layer via the plurality of second contact holes; and (5) performing a deposition and patterning process to sequentially form a planarization layer, an anode layer, a pixel defining layer, and a photoresist layer on the organic interlayer dielectric layer, wherein the anode layer is electrically connected to the first portion of the second source and drain metal layer.

6. The method for manufacturing the flexible display panel according to claim 5, wherein the step (2) further comprises forming a deep hole in the buffer layer, the first gate insulation layer, and the second gate insulation layer in a bending area of the flexible substrate; performing a deposition and etching process to form the first source and drain metal layer in the deep hole in the bending area, wherein the first source and drain metal layer in the bending area in the deep hole is formed to have a stepped structure.

7. The method for manufacturing the flexible display panel according to claim 6, wherein the step of forming the deep hole in the buffer layer, the first gate insulation layer, and the second gate insulation layer in the bending area comprises:

forming a first opening in the first gate insulation layer and the second gate insulation layer in the bending area; and forming a second opening in the buffer layer in the bending area to correspond to the first opening, wherein the second opening is connected to the first opening to constitute the deep hole.

8. The method for manufacturing the flexible display panel according to claim 7, wherein a bottom of the second opening is disposed on the flexible substrate in the bending area or is disposed on the buffer layer in the bending area.

9. The method for manufacturing the flexible display panel according to claim 7, wherein a size of the first opening is greater than a size of the second opening, such that the second opening is entirely exposed.

10. The method for manufacturing the flexible display panel according to claim 6, wherein the step (4) further comprises:

forming the plurality of second contact holes in the organic interlayer dielectric layer in the bending area such that the plurality of second contact holes are positioned to correspond to two ends of the deep hole; and performing a deposition and etching process to form the second source and drain metal layer on the organic interlayer dielectric layer in the bending area, wherein a portion of the second source and drain metal layer in the bending area is electrically connected to the first source and drain metal layer in the bending area via the plurality of second contact holes in the bending area.

11. A flexible display panel, comprising:
a flexible substrate having a display area;

a buffer layer, an active layer, a first gate insulation layer, a gate electrode layer, and a second gate insulation layer sequentially disposed on the flexible substrate;

a first source and drain metal layer disposed on the second gate insulation layer in the display area, wherein a first portion of the first source and drain metal layer is electrically connected to a first portion of the active layer via one of a plurality of first contact holes, a second portion of the first source and drain metal layer is electrically connected to a first portion of the gate electrode layer via one of the plurality of first contact holes, a third portion of the first source and drain metal layer is disposed above a second portion of the gate electrode layer;

an organic interlayer dielectric layer disposed on the second gate insulation layer, wherein the organic interlayer dielectric layer is exposed and developed to expose the first source and drain metal layer;

a second source and drain metal layer disposed on the organic interlayer dielectric layer in the display area, wherein a first portion of the second source and drain metal layer is electrically connected to a second portion of the active layer via a plurality of second contact holes, a second portion of the second source and drain metal layer is electrically connected to a fourth portion of the first source and drain metal layer via the plurality of second contact holes; and a planarization layer, an anode layer, a pixel defining layer, and a photoresist layer sequentially disposed on the organic interlayer dielectric layer, wherein the anode layer is electrically connected to the first portion of the second source and drain metal layer.

12. The flexible display panel according to claim 11, wherein the flexible substrate further has a bending area;

the first source and drain metal layer is further disposed in a deep hole in the bending area, and the first source and drain metal layer is configured to have a stepped structure in the deep hole.

13. The flexible display panel according to claim 12, wherein a bottom of the deep hole is disposed on the flexible substrate in the bending area or is disposed on the buffer layer in the bending area.

14. The flexible display panel according to claim 12, wherein the second source and drain metal layer is further disposed on the organic interlayer dielectric layer in the bending area, a portion of the second source and drain metal layer in the bending area is electrically connected to the first source and drain metal layer in the bending area via the plurality of second contact holes in the bending area.

* * * * *